United States Patent
Asahi et al.

(10) Patent No.: US 10,181,460 B2
(45) Date of Patent: Jan. 15, 2019

(54) METHOD FOR MANUFACTURING SEMICONDUCTOR DEVICE, SEMICONDUCTOR MOUNTING DEVICE, AND MEMORY DEVICE MANUFACTURED BY METHOD FOR MANUFACTURING SEMICONDUCTOR DEVICE

(71) Applicant: TORAY ENGINEERING CO., LTD., Chuo-ku, Tokyo (JP)

(72) Inventors: Noboru Asahi, Otsu (JP); Yoshiyuki Arai, Otsu (JP); Yoshinori Miyamoto, Otsu (JP); Shimpei Aoki, Otsu (JP); Masatsugu Nimura, Otsu (JP)

(73) Assignee: TORAY ENGINEERING CO., LTD., Tokyo (JP)

( * ) Notice: Subject to any disclaimer, the term of this patent is extended or adjusted under 35 U.S.C. 154(b) by 0 days.

(21) Appl. No.: 15/562,501

(22) PCT Filed: Mar. 29, 2016

(86) PCT No.: PCT/JP2016/060079
§ 371 (c)(1),
(2) Date: Sep. 28, 2017

(87) PCT Pub. No.: WO2016/158935
PCT Pub. Date: Oct. 6, 2016

(65) Prior Publication Data
US 2018/0096980 A1    Apr. 5, 2018

(30) Foreign Application Priority Data
Mar. 30, 2015  (JP) .................................. 2015-069740

(51) Int. Cl.
*H01L 21/00*  (2006.01)
*H01L 25/00*  (2006.01)
(Continued)

(52) U.S. Cl.
CPC ........ *H01L 25/50* (2013.01); *H01L 21/67092* (2013.01); *H01L 21/67144* (2013.01);
(Continued)

(58) Field of Classification Search
None
See application file for complete search history.

(56) References Cited

U.S. PATENT DOCUMENTS

2010/0129960 A1   5/2010  Mejima et al.

FOREIGN PATENT DOCUMENTS

JP   2007-250886 A   9/2007
JP   2008-130706 A   6/2008
(Continued)

OTHER PUBLICATIONS

International Search Report of the corresponding International Application No. PCT/JP2016/060079, dated Jun. 7, 2016.

*Primary Examiner* — Reema Patel
(74) *Attorney, Agent, or Firm* — Global IP Counselors, LLP

(57) ABSTRACT

A method for manufacturing a semiconductor device includes laminating a plurality of semiconductor wafers via an adhesive, heating such that the adhesive reaches a specific viscosity, and pressing the semiconductor wafers under a provisional pressure bonding load such that a gap between solder of through-electrodes provided to chip parts and through-electrodes of an adjacent semiconductor wafer falls within a specific range that is greater than zero, to produce a provisional pressure-bonded laminate; cutting the provisional pressure-bonded laminate with a cutter to produce a provisional pressure-bonded laminate chip part; and heating the provisional pressure-bonded laminate chip part to at least curing temperature of the adhesive and at least melting point of the solder, and pressing the provisional pressure-bonded (Continued)

laminate chip part under a main pressure bonding load to produce a main pressure-bonded laminate chip part such that the solder comes into contact with the through-electrodes of adjacent chip parts.

18 Claims, 13 Drawing Sheets

(51) Int. Cl.
    *H01L 21/78*     (2006.01)
    *H01L 21/67*     (2006.01)
    *H01L 23/00*     (2006.01)
    *H01L 25/065*     (2006.01)
    *B28D 5/02*     (2006.01)

(52) U.S. Cl.
    CPC .............. *H01L 21/78* (2013.01); *H01L 24/73* (2013.01); *H01L 24/92* (2013.01); *H01L 24/94* (2013.01); *B28D 5/029* (2013.01); *H01L 24/13* (2013.01); *H01L 24/16* (2013.01); *H01L 24/29* (2013.01); *H01L 24/32* (2013.01); *H01L 24/81* (2013.01); *H01L 24/83* (2013.01); *H01L 25/0657* (2013.01); *H01L 2224/05571* (2013.01); *H01L 2224/13009* (2013.01); *H01L 2224/13082* (2013.01); *H01L 2224/13116* (2013.01); *H01L 2224/16145* (2013.01); *H01L 2224/2919* (2013.01); *H01L 2224/32145* (2013.01); *H01L 2224/73104* (2013.01); *H01L 2224/73204* (2013.01); *H01L 2224/7598* (2013.01); *H01L 2224/75252* (2013.01); *H01L 2224/81203* (2013.01); *H01L 2224/81815* (2013.01); *H01L 2224/83191* (2013.01); *H01L 2224/83203* (2013.01); *H01L 2224/83862* (2013.01); *H01L 2224/83907* (2013.01); *H01L 2224/9205* (2013.01); *H01L 2224/94* (2013.01); *H01L 2225/06513* (2013.01); *H01L 2225/06541* (2013.01); *H01L 2225/06565* (2013.01)

(56) References Cited

FOREIGN PATENT DOCUMENTS

| | | |
|---|---|---|
| JP | 2008-294382 A | 12/2008 |
| JP | 2012-160634 A | 8/2012 |
| JP | 2013-065835 A | 4/2013 |
| JP | 2013-225642 A | 10/2013 |
| WO | 2010-109985 A1 | 9/2010 |
| WO | 2013-133015 A1 | 9/2013 |

METHOD FOR MANUFACTURING SEMICONDUCTOR DEVICE, SEMICONDUCTOR MOUNTING DEVICE, AND MEMORY DEVICE MANUFACTURED BY METHOD FOR MANUFACTURING SEMICONDUCTOR DEVICE

This application is a U.S. National stage of International Application No. PCT/JP2016/060079 filed on Mar. 29, 2016. This application claims priority to Japanese Patent Application No. 2015-069740 filed with Japan Patent Office on Mar. 30, 2015. The entire disclosure of Japanese Patent Application No. 2015-069740 is hereby incorporated herein by reference.

BACKGROUND

Field of the Invention

The present invention relates to a method for manufacturing a semiconductor device and to a semiconductor mounting apparatus. More particularly, the present invention relates to a method for manufacturing a semiconductor device in which a plurality of semiconductor wafers on which chip parts have been formed are laminated and electrically connected, to a semiconductor mounting apparatus, and to a memory device manufactured by a method for manufacturing a semiconductor device.

Background Information

Conventionally, in order to accommodate higher precision and miniaturization of a pattern on a substrate having a circuit composed of a conductor such as copper wiring, a semiconductor device manufacturing method and a semiconductor mounting device are known in which a plurality of chip parts composed of semiconductor elements are laminated via an adhesive on pads formed on semiconductor wafers, and this product is heated and pressed to connect the chip parts to the semiconductor wafers. An example of this is Japanese Laid-Open Patent Application Publication No. 2013-225642 (Patent Document 1).

The method for manufacturing a semiconductor device described in Patent Literature 1 includes a repeated bonding step, in which semiconductor components (chip parts) are laminated on a substrate (semiconductor wafer) via a resin layer (adhesive) and then heating is performed at or over the temperature at which the resin semi-cures and below the temperature at which the solder melts, and this bonding step is performed a plurality of times; and a solder joining step of squeezing a plurality of laminated semiconductor parts and heating to at least the temperature at which the solder melts in order to solder the substrate and the semiconductor parts together and solder the laminated semiconductors together. This diminishes bonding defects between the substrate and the semiconductor parts and between the laminated semiconductors. However, a drawback to the technique described in Patent Literature 1 is that the mounting time increases as the number of laminations and the number of mounting sites of the semiconductor parts increase.

SUMMARY

It is an object of the present invention to provide a method for manufacturing a semiconductor device, a semiconductor mounting device, and a memory device manufactured by a method for manufacturing a semiconductor device, with which how long it takes to manufacture a semiconductor device in which chip parts are laminated can be shortened, and there will be fewer joining defects and the like between chip parts.

The problem to be solved by the present invention is as described above, and the means for solving this problem will now be described.

Specifically, the present invention is a method for manufacturing a semiconductor device in which a plurality of semiconductor wafers having chip parts formed thereon are laminated and electrically connected, the method comprising a provisional pressure bonding step of laminating a plurality of semiconductor wafers via an adhesive, heating so that the adhesive reaches a specific viscosity, and pressing the semiconductor wafers under a provisional pressure bonding load so that the gap between the solder of the through-electrodes provided to the chip parts and the through-electrodes of the adjacent semiconductor wafers will fall within a specific range that is greater than zero, to produce a provisional pressure-bonded laminate; a cutting step of cutting the provisional pressure-bonded laminate with a cutting means to produce a provisional pressure-bonded laminate chip part in which chip parts have been laminated; and a main pressure bonding step of heating the provisional pressure-bonded laminate chip part to at least the curing temperature of the adhesive and at least the melting point of the solder, and pressing the provisional pressure-bonded laminate chip part under a main pressure bonding load to produce a main pressure-bonded laminate chip part so that the solder comes into contact with the through-electrodes of adjacent chip parts.

With the present invention, in the cutting step, the cutting means cuts the laminated semiconductor wafers one at a time.

With the present invention, in the cutting step, the cutting means is constituted by a dicing blade, and the width of the dicing blade is reduced every time a semiconductor wafer is cut.

With the present invention, in the provisional pressure bonding step, the semiconductor wafers are heated and pressed in a vacuum.

With the present invention, in the provisional pressure bonding step, the semiconductor wafers are laminated on a support substrate, and the support substrate is removed from the provisional pressure-bonded laminate thus produced after heating and pressing.

The present invention is also memory device manufactured by any one of the above-mentioned methods for manufacturing a semiconductor device.

The present invention is also a semiconductor mounting device, which is a device for manufacturing a semiconductor device in which a plurality of semiconductor wafers on which chip parts have been formed are laminated and electrically connected, the semiconductor mounting device comprising a provisional pressure bonding device that laminates a plurality of semiconductor wafers via an adhesive, heats these so that the adhesive reaches a specific viscosity, and presses the semiconductor wafers under a provisional pressure bonding load to produce the provisional pressure-bonded laminate so that the gap between the solder of the through-electrodes provided to the chip parts and the through-electrodes of the adjacent semiconductor wafers will fall within a specific range that is greater than zero; a cutting device that cuts the provisional pressure-bonded laminate with a cutting means to produce a provisional pressure-bonded laminate chip part in which chip parts have been laminated; and an expulsion means for acquiring ahead of time the locations of any defective chip parts out of the chip parts formed on the semiconductor wafers, and expelling any provisional pressure-bonded laminate chip parts that include defective chip parts out of the provisional pressure-bonded laminate chip parts that have been produced.

The effects of the present invention are as follows.

In the present invention, a plurality of chip parts are laminated all at once, and the main pressure bonding is performed after this laminate has been cut into provisional pressure-bonded laminate chip parts, so voids are less likely to occur. Also, reducing the gap between the semiconductor wafers makes it less likely that the semiconductor wafers will become misaligned during cutting. This shortens how long it takes to manufacture a semiconductor device in which chip parts are laminated and also makes it less likely that there will be joining defects between chip parts. Also, when chip parts are provisionally pressure bonded one at a time as is done conventionally, if the chip parts are thin the adhesive may bulge out and contaminate the tops of the chip parts or attachments, but with the present invention, the lamination can be performed as wafers, so a provisional pressure-bonded laminate with no bulging of the adhesive after provisional pressure bonding can be formed.

In the present invention, the cutting accuracy of the cutting means is improved and the effect that the cutting means has on the pressure-bonded laminate is kept to a minimum. Consequently, how long it takes to manufacture a semiconductor device in which the chip parts are laminated can be shortened, and joining defects between chip parts and the like will be less likely to occur.

In the present invention, the cutting accuracy of the dicing blade is improved and the effect that the dicing blade has on the pressure-bonded laminate is kept to a minimum. Consequently, how long it takes to manufacture a semiconductor device in which the chip parts are laminated can be shortened, and joining defects between chip parts and the like will be less likely to occur.

In the present invention, the occurrence of voids is suppressed. Consequently, how long it takes to manufacture a semiconductor device in which the chip parts are laminated can be shortened, and joining defects between chip parts and the like will be less likely to occur.

In the present invention, occurrence of warping or the like of the semiconductor wafers is suppressed. Consequently, how long it takes to manufacture a semiconductor device in which the chip parts are laminated can be shortened, and joining defects between chip parts and the like will be less likely to occur.

In the present invention, defective products other than joining defects are expelled. Consequently, how long it takes to manufacture a semiconductor device in which the chip parts are laminated can be shortened, and joining defects between chip parts and the like will be less likely to occur.

DETAILED DESCRIPTION OF EMBODIMENTS

Figure 1:
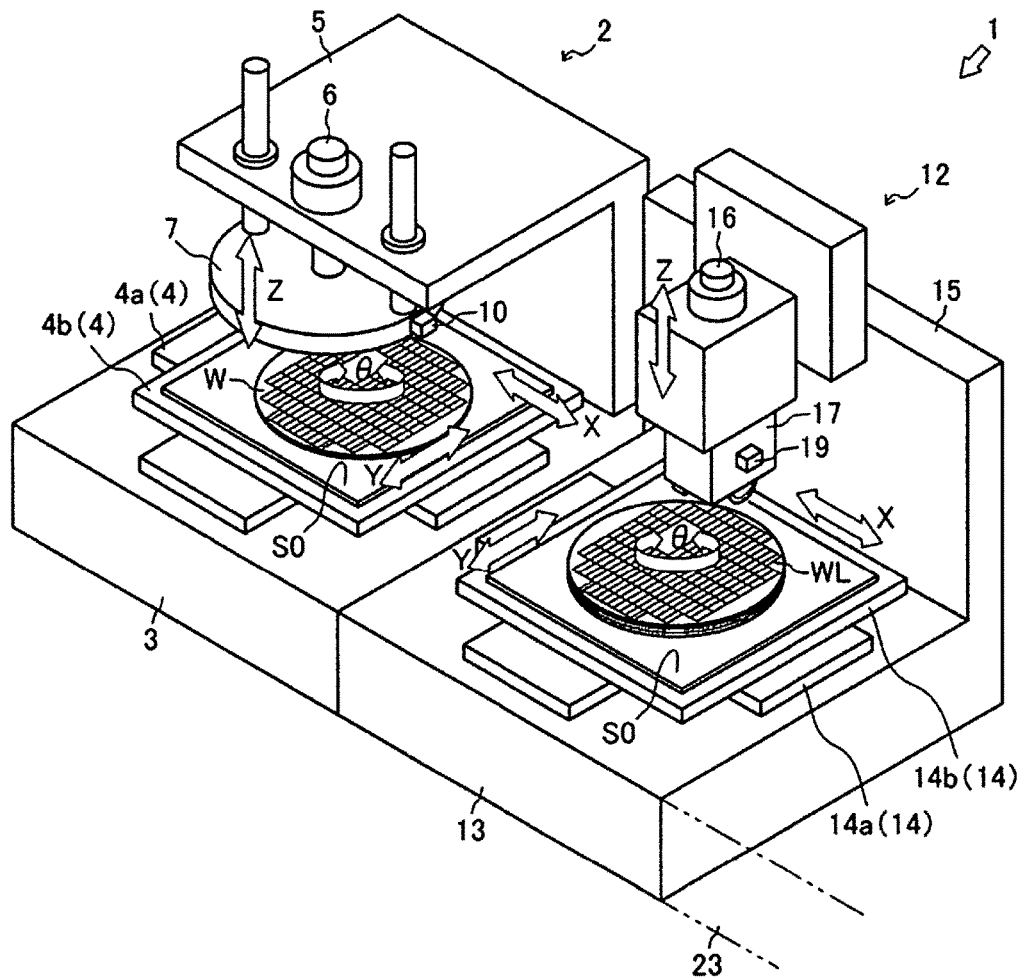
FIG. 1 is a simplified diagram showing a provisional pressure bonding device and a cutting apparatus in the semiconductor mounting apparatus pertaining to an embodiment of the present invention.

First, a semiconductor mounting device 1 that is an embodiment of the semiconductor mounting device pertaining to the present invention will be described through reference to FIGS. 1 to 4. In the following description, the direction in which the semiconductor wafer W is conveyed from a provisional pressure bonding device 2 to a main pressure bonding device 22 will be referred to as the X axis direction, the movement direction of a provisional pressure bonding head 7, a cutting head 17, and a main pressure bonding head 27 perpendicular to the semiconductor wafer W will be referred to as the Z axis direction, and the direction of rotation around the Z axis will be referred to as the θ direction. In this embodiment, the provisional pressure bonding device 2, a cutting device 12, and the main pressure bonding device 22 are each configured as an embodiment of the semiconductor mounting device 1, but the present invention is not limited to or by these.

A plurality of chip parts P which are semiconductor elements are formed on the semiconductor wafer W. A through-electrode Pb is formed on each chip part P, and solder Pa is provided at one or both end portions of each through-electrode Pb. Furthermore, a nonconductive film (hereinafter referred to simply as an "NCF") composed of a thermosetting resin, which is an adhesive, is affixed so as to cover the solder Pa. Also, in this embodiment, the provisional pressure-bonded laminate WL constituted by the lamination of the semiconductor wafers W has a first semiconductor wafer W1, a second semiconductor wafer W2, a third semiconductor wafer W3, and so forth laminated in that order from the lower side. In this embodiment, the provisional pressure-bonded laminate WL is constituted by the first semiconductor wafer W1, the second semiconductor wafer W2, and the third semiconductor wafer W3. The NCF here is affixed so as to cover the solder Pa of the semiconductor wafers W beforehand, but this is not the only option. The semiconductor wafers W are laminated on a support substrate S0.

As shown in FIG. 1, the semiconductor mounting device 1 is used to manufacture a semiconductor device in which a plurality of chip parts P are laminated and electrically connected. The semiconductor mounting device 1 comprises the provisional pressure bonding device 2, the cutting device 12, the main pressure bonding device 22, a conveyor device 30, and a controller 31. In the semiconductor mounting device 1, the provisional pressure bonding device 2, the cutting device 12, and the main pressure bonding device 22 are disposed adjacent to each other.

The provisional pressure bonding device 2 provisionally pressure bonds semiconductor wafers W to each other with the NCF, which is an adhesive. That is, the provisional pressure bonding device 2 is used to produce the provisional pressure-bonded laminate WL in which the semiconductor wafers W are laminated. The provisional pressure bonding device 2 comprises a provisional pressure bonding base 3, a provisional pressure bonding stage 4, a provisional pressure bonding support frame 5, a provisional pressure bonding unit 6, the provisional pressure bonding head 7, a provisional pressure bonding heater 8, a provisional pressure bonding attachment 9, and a provisional pressure bonding image recognition device 11.

The provisional pressure bonding base 3 is the final structural body constituting the provisional pressure bonding device 2. The provisional pressure bonding base 3 is configured by combining pipe materials or the like so as to have sufficient rigidity. The provisional pressure bonding base 3 supports the provisional pressure bonding stage 4 and the provisional pressure bonding support frame 5.

The provisional pressure bonding stage 4 moves the semiconductor wafers W to the desired position while holding them. The preliminary pressure bonding stage 4 is configured such that a suction table 4b capable of holding the semiconductor wafers W or the support substrate S0 to a drive unit 4a by suction. The provisional pressure bonding stage 4 is attached to the provisional pressure bonding base 3, and is configured so that the suction table 4b can be moved in the X axis direction, the Y axis direction, and the θ direction by the drive unit 4a. That is, the provisional pressure bonding stage 4 is configured to be able to move the semiconductor wafers W or the support substrate S0 held by suction onto the suction table 4b on the provisional pressure bonding base 3 in the X axis direction, the Y axis direction, and the θ direction. In this embodiment, the provisional pressure bonding stage 4 holds the semiconductor wafers W or the support substrate S0 by suction, but this is not the only option.

The provisional pressure bonding support frame 5 supports the provisional pressure bonding unit 6. The provisional pressure bonding support frame 5 is formed in a plate shape and is configured to extend in the Z axis direction from near the provisional pressure bonding stage 4 of the provisional pressure bonding base 3.

The provisional pressure bonding unit 6, which is a pressing unit, moves the provisional pressure bonding head 7. The provisional pressure bonding unit 6 is made up of a servo motor and a ball screw (not shown). The provisional pressure bonding unit 6 is configured to generate a drive force in the axial direction of the ball screw by rotating the ball screw with the servo motor. The provisional pressure bonding unit 6 is attached to the provisional pressure bonding support frame 5 so that the axial direction of the ball screw is the Z axis direction perpendicular to the semiconductor wafers W. That is, the provisional pressure bonding unit 6 is configured to generate a drive force (pressing force) in the Z axis direction. The provisional pressure bonding unit 6 is configured so that a provisional pressure bonding load Ft, which is the pressing force in the Z axis direction, can be set as desired by controlling the output of the servo motor. In this embodiment, the provisional pressure bonding unit 6 is constituted by a servo motor and a ball screw, but it is not limited to this, and it may instead be constituted by a pneumatic actuator or a hydraulic actuator.

The provisional pressure bonding head 7 is used to transmit the drive force of the provisional pressure bonding unit 6 to the semiconductor wafers W. The provisional pressure bonding head 7 is attached to a ball screw nut (not shown) that is part of the provisional pressure bonding unit 6. Also, the provisional pressure bonding unit 6 is disposed opposite the provisional pressure bonding stage 4. That is, the provisional pressure bonding head 7 is configured to be movable in the Z axis direction by the provisional pressure bonding unit 6 so as to approach the provisional pressure bonding stage 4. The provisional pressure bonding head 7 is provided with the provisional pressure bonding heater 8, the provisional pressure bonding attachment 9, and a provisional pressure bonding distance sensor 10 (see FIG. 3A).

Figure 3A:
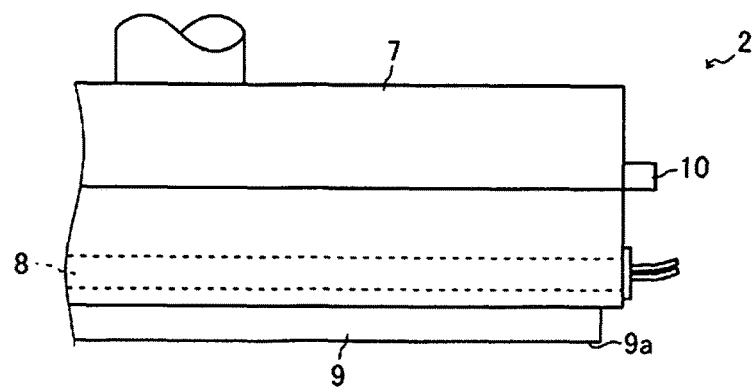
FIG. 3A is a simplified diagram showing the configuration of the provisional pressure bonding head of the semiconductor mounting device pertaining to an embodiment of the present invention.

As shown in FIG. 3A, the provisional pressure bonding heater 8 is used to heat the semiconductor wafers W. The provisional pressure bonding heater 8 is made up of a cartridge heater, and is incorporated into a hole or the like formed in the provisional pressure bonding head 7. In this embodiment, the provisional pressure bonding heater 8 is constituted by a cartridge heater, but it is not limited to this, and can be anything capable of heating the semiconductor wafers W.

The provisional pressure bonding attachment 9 is used to hold the semiconductor wafers W and transmit pressing force and heat. The provisional pressure bonding attachment 9 is provided to the provisional pressure bonding head 7 so as to be opposite the provisional pressure bonding stage 4. The provisional pressure bonding attachment 9 is configured so that it can hold the semiconductor wafers W by suction while positioning them. The suction holding face 9a of the provisional pressure bonding attachment 9 is formed substantially parallel to the provisional pressure bonding stage 4. Consequently, the suction holding face 9a of the provisional pressure bonding attachment 9 is configured so that the spacing to the opposing provisional pressure bonding stage 4 is substantially the same over the entire surface. Also, the provisional pressure bonding attachment 9 is configured to be heated by the provisional pressure bonding heater 8. That is, the provisional pressure bonding attachment 9 is configured to position and hold the semiconductor wafers W and to heat the NCF affixed to the semiconductor wafers W by heat transfer from the provisional pressure bonding heater 8.

The provisional pressure bonding distance sensor 10 is used to measure the distance in the Z axis direction of the provisional pressure bonding head 7 from an arbitrary reference position. The provisional pressure bonding distance sensor 10 is made up of a distance sensor that makes use of various kinds of laser light. The provisional pressure bonding distance sensor 10 measures the distance from an arbitrary reference position on the provisional pressure bonding head 7 to each of the provisionally pressure-bonded semiconductor wafers W. That is, the provisional pressure bonding distance sensor 10 measures the distance L (m) to the m-th semiconductor wafer W (m) after provisional pressure bonding to constitute the provisional pressure-bonded laminate WL. In this embodiment, the provisional pressure bonding distance sensor 10 measures the distance L1 to the first semiconductor wafer W1, the distance L2 to the second semiconductor wafer W2 after provisional pressure bonding, and the distance L3 to the third semiconductor wafer W3 after provisional pressure bonding. In this embodiment, the provisional pressure bonding distance sensor 10 is configured to use laser light, but it is not limited to this, and may make use of ultrasonic waves, or may be configured to calculate from an encoder of a linear scale or a servo motor.

Figure 4:
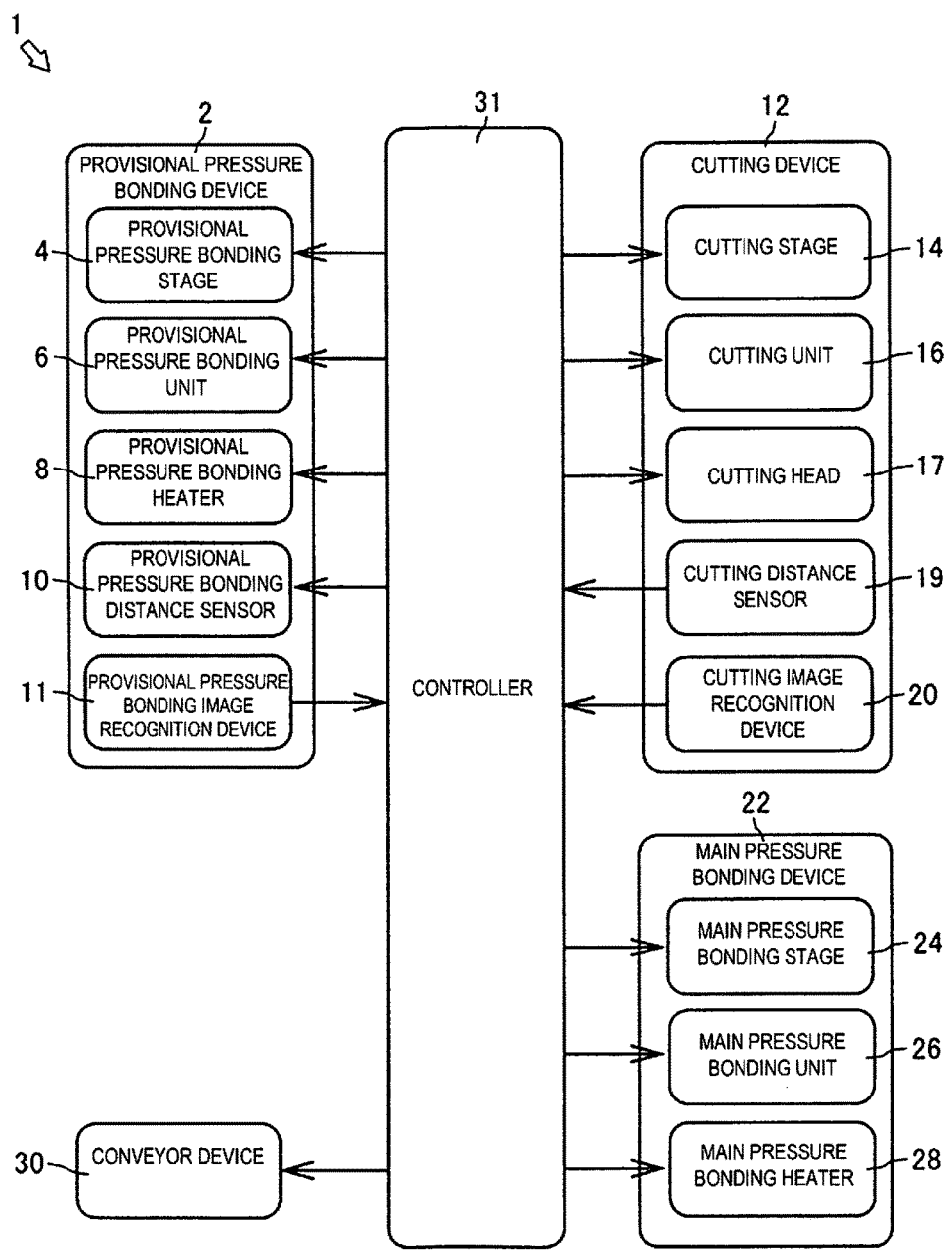
FIG. 4 is a block diagram showing the control configuration of the semiconductor mounting device pertaining to an embodiment of the present invention.

As shown in FIG. 4, the provisional pressure bonding image recognition device 11 is used to acquire position information about the semiconductor wafers W from an image. The provisional pressure bonding image recognition device 11 is configured to recognize alignment marks on the semiconductor wafers W held by suction to the provisional pressure bonding stage 4, and the alignment marks on the semiconductor wafer W held by the provisional pressure bonding attachment 9, and thereby acquire position information about the semiconductor wafers W.

Figure 2:
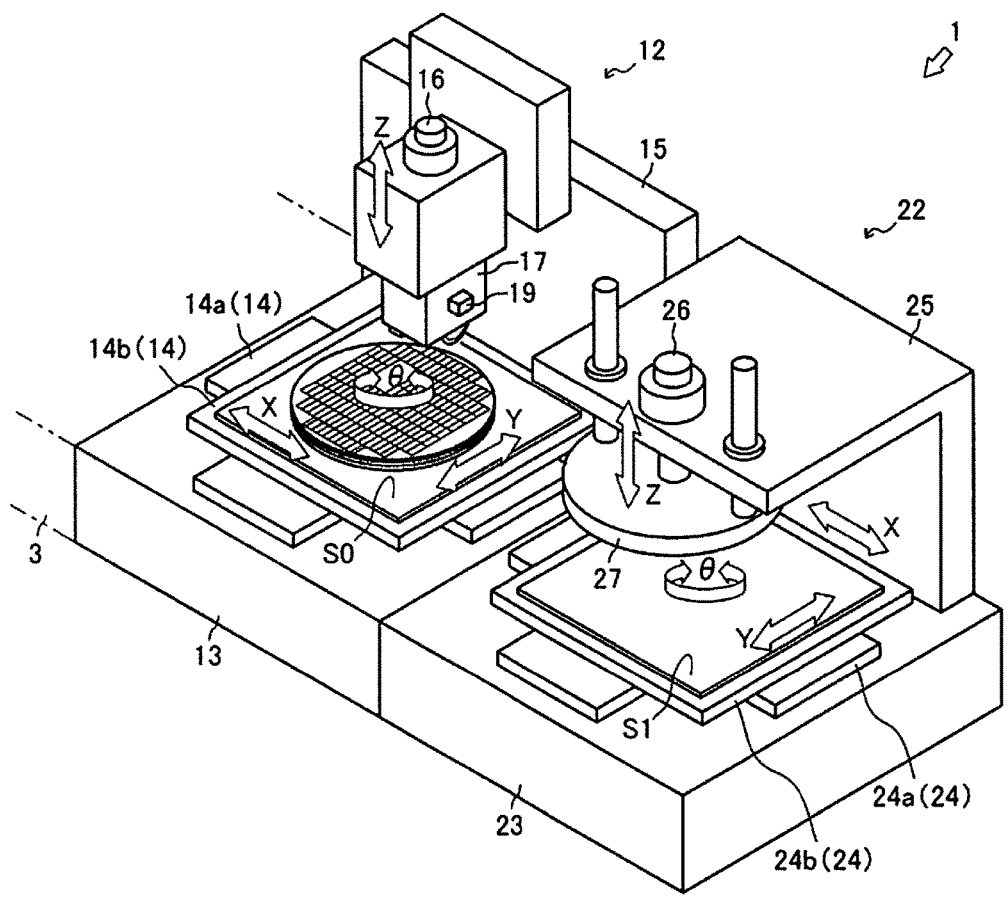
FIG. 2 is a simplified view diagram a cutting apparatus and a main pressure bonding device in the semiconductor mounting apparatus pertaining to an embodiment of the present invention.

As shown in FIGS. 1 and 2, the cutting device 12 cuts the provisional pressure-bonded laminate WL in which the semiconductor wafers W are laminated. That is, the cutting device 12 is used to manufacture a provisional pressure-bonded laminate chip part PL. The cutting device 12 comprises a cutting base 13, a cutting stage 14, a cutting support frame 15, a cutting unit 16, the cutting head 17, dicing blades 18 (cutting means), a cutting distance sensor 19 (cutting measurement means), and a cutting image recognition device 20. Since the cutting base 13, the cutting stage 14, the cutting support frame 15, and the cutting image recognizing device 20 have substantially the same configuration as in the provisional pressure bonding device 2, parts that are the same will not be described again in specific terms, and the description will focus on the differences.

The cutting unit 16 is used to move the cutting head 17. The cutting unit 16 is made up of a moving servo motor and a ball screw (not shown). The cutting unit 16 is configured to generate a drive force in the axial direction of the ball screw by rotating the ball screw with the servo motor. The cutting unit 16 is attached to the cutting support frame 15 so that the movement direction is the Z axis direction perpendicular to the semiconductor wafers W. That is, the cutting unit 16 is configured to generate a drive force (pressing force) in the Z axis direction while moving the cutting head 17 to the desired position. The cutting unit 16 is configured so that the cutting load Fc (the pressing force in the Z axis direction) can be set as desired by controlling the output of the servo motor. In this embodiment, the cutting unit 16 is configured as a servo motor and a ball screw, but it is not limited to this, and may instead be made up of a pneumatic actuator or a hydraulic actuator.

The cutting head 17 is used to transmit the drive force of the cutting unit 16 to the semiconductor wafer W and selectively rotate the plurality of dicing blades 18 (cutting means). The cutting head 17 is attached to a ball screw nut (not shown) that is part of the cutting unit 16. Also, the provisional pressure bonding unit 6 is disposed opposite the cutting stage 14. That is, the cutting head 17 is configured to be movable in the Z axis direction by the cutting unit 16 so as to approach the cutting stage 14. The cutting head 17 is provided with a motor for the dicing blades 18 (not shown), the plurality of dicing blades 18, and the cutting distance sensor 19 (see FIG. 3B).

Figure 3B:
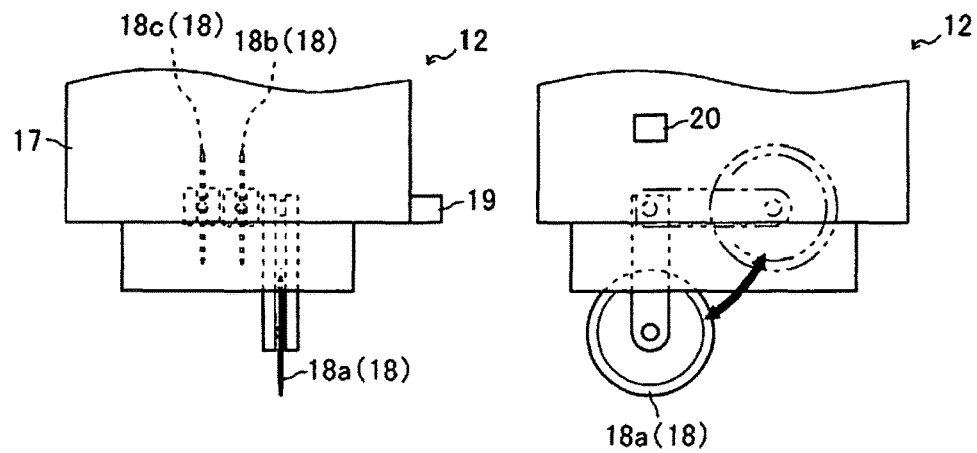
FIG. 3B is a simplified diagram showing the configuration of the cutting head of the semiconductor mounting device pertaining to an embodiment of the present invention.
Figure 3C:
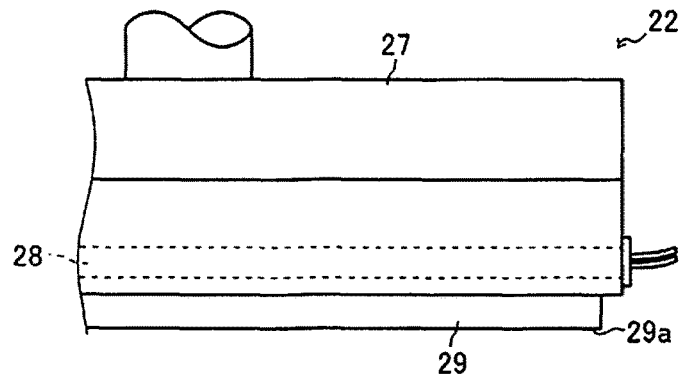
FIG. 3C is a simplified diagram showing the configuration of the main pressure bonding head of the semiconductor mounting device pertaining to an embodiment of the present invention.

As shown in FIG. 3B, the dicing blades 18 (cutting means) are blades for cutting the semiconductor wafers W. The dicing blades 18 are rotatably driven by the cutting head 17. A plurality of the dicing blades 18 having different blade widths are provided according to the number of laminated semiconductor wafers W. In this embodiment, when three semiconductor wafers W are laminated, the dicing blades 18 are configured such that a first dicing blade 18a, a second dicing blade 18b, and a third dicing blade 18c, whose blade widths decrease in that order, are provided to the cutting head 17. The first dicing blade 18a, the second dicing blade 18b, and the third dicing blade 18c are configured so that they can be housed inside the cutting head 17 (see black arrow in FIG. 3B), and are selectively used according to which layer of the provisional pressure-bonded laminate WL is to be cut.

The cutting distance sensor 19 is used to measure the distance in the Z axis direction from an arbitrary reference position. The cutting distance sensor 19 is constituted by a displacement sensor that makes use of various kinds of laser light. The cutting distance sensor 19 is configured to measure the distance L(n) to the n-th semiconductor wafer W(n), which is the distance from an arbitrary reference position of the cutting head 17 to the provisional pressure-bonded laminate WL. In this embodiment, the cutting distance sensor 19 is constituted to make use of laser light, but is not limited to this, and may make use of ultrasonic waves, or may be configured to calculate from an encoder of a linear scale or a servo motor.

As shown in FIG. 2, the main pressure bonding device 22 is used to bond the chip parts P together with the NCF (an adhesive) and to melt the solder Pa to electrically connect the parts to the through-electrodes Pb of the adjacent chip parts P. That is, the main pressure bonding device 22 is used to produce the main pressure-bonded laminate chip part PL. The main pressure bonding device 22 comprises a main pressure bonding base 23, a main pressure bonding stage 24, a main pressure bonding support frame 25, a main pressure bonding unit 26, the main pressure bonding head 27, a main pressure bonding heater 28, and a main pressure bonding attachment 29. Since the main pressure bonding base 23, the main pressure bonding stage 24, the main pressure bonding support frame 25, and the main pressure bonding heater 28 have substantially the same configuration as in the provisional pressure bonding device 2, parts that are the same will not be described again in specific terms, and the description will focus on the differences.

The main pressure bonding unit 26 (pressing unit) is used to move the main pressure bonding head 27. The main pressure bonding unit 26 is constituted by a servo motor and a ball screw (not shown). The main pressure bonding unit 26 is configured to generate a drive force in the axial direction of the ball screw by rotating the ball screw with the servo motor. The main pressure bonding unit 26 is attached to the support frame so that the axial direction of the ball screw is the Z axis direction perpendicular to the semiconductor wafers W. That is, the main pressure bonding unit 26 is configured to generate a drive force (pressing force) in the Z axis direction. The main pressure bonding unit 26 is configured so that the main pressure bonding load Fp (the pressing force in the Z axis direction) can be set as desired by controlling the output of the servo motor. In this embodiment, the main pressure bonding unit 26 is constituted by a servo motor and a ball screw, but it is not limited to this, and may instead be constituted by a pneumatic actuator or a hydraulic actuator.

The main pressure bonding head 27 is used to transmit the drive force of the main pressure bonding unit 26 uniformly to the provisional pressure-bonded laminate chip part PL. The main pressure bonding head 27 is attached to a ball screw nut (not shown) that is part of the main pressure bonding unit 26. Also, the main pressure bonding unit 26 is disposed opposite the main pressure bonding stage 24. That is, the main pressure bonding unit 26 is configured to be movable in the Z axis direction by the main pressure bonding unit 26 so as to approach the main pressure bonding stage 24. The main pressure bonding head 27 is provided with the main pressure bonding heater 28 and the main pressure bonding attachment 29.

The main pressure bonding attachment 29 comes into contact with the provisional pressure-bonded laminate chip part PL to transmit pressing force and heat. The main pressure bonding attachment 29 is provided to the main pressure bonding head 27 so as to be opposite the main pressure bonding stage 24. A main pressure bonding contact face 29a that allows a plurality of provisional pressure-bonded laminate chip parts PL to be collectively pressed is formed on the pressure bonding attachment 29. The main pressure bonding contact face 29a is formed substantially parallel to the main pressure bonding stage 24 in the main pressure bonding attachment 29. Consequently, the main pressure bonding contact face 29a is configured so that the spacing from the opposing main pressure bonding stage 24 is substantially uniform over the entire surface thereof. That is, the main pressure bonding attachment 29 is configured so that the main pressure bonding contact face 29a makes contact with a plurality of provisional pressure-bonded laminate chip parts PL at substantially the same time, allowing the parts to be pressed all at once. Furthermore, the main pressure bonding attachment 29 is configured to be heated by the main pressure bonding heater 28. That is, the main pressure bonding attachment 29 is configured so that the heat of the main pressure bonding heater 28 is conducted to a plurality of provisional pressure-bonded laminate chip parts PL under the same conditions, and a plurality of provisional pressure-bonded laminate chip parts PL can be pressed at substantially the same time.

As shown in FIG. 4, the conveyor device 30 is used to transfer the provisional pressure-bonded laminate WL between the provisional pressure bonding device 2 and the cutting device 12, and to transfer the provisional pressure-bonded laminate chip parts PL between the cutting device 12 and the main pressure bonding device 22. The conveyor device 30 is configured so that the support substrate S0 on which the provisional pressure-bonded laminate WL was disposed from the provisional pressure bonding stage 4 of the provisional pressure bonding device 2 can be conveyed to the provisional pressure bonding stage 4 of the provisional pressure bonding device 2, and the provisional pressure-bonded laminate chip parts PL can be conveyed from the provisional pressure bonding stage 4 of the provisional pressure bonding device 2 to a mounting substrate S1 on the main pressure bonding stage 24 of the main pressure bonding device 22.

The controller 31 is used to control the provisional pressure bonding device 2, the cutting device 12, the main pressure bonding device 22, the conveyor device 30, etc. The control device 31 may be configured so that it is substantively connected by a bus to a CPU, ROM, RAM, HDD, etc., or may consist of a one-chip LSI or the like. The controller 31 holds various kinds of program and data in order to control the provisional pressure bonding device 2, the cutting device 12, the main pressure bonding device 22, the conveyor device 30, etc.

The controller 31 is connected to the provisional pressure bonding stage 4, the cutting stage 14, and the main pressure bonding stage 24, and controls the amount of movement by the provisional pressure bonding stage 4, the cutting stage 14, and the main pressure bonding stage 24 in the X axis direction, the Y axis direction, and the θ direction.

The controller 31 is connected to the provisional pressure bonding heater 8 and the main pressure bonding heater 28, and can control the temperature of the provisional pressure bonding heater 8 and the main pressure bonding heater 28.

The controller 31 is connected to the provisional pressure bonding unit 6, the cutting unit 16, and the main pressure bonding unit 26, and can control the operating mode of the dicing blades 18 of the cutting unit 16 and the pressing force in the X axis direction of the provisional pressure bonding unit 6, the cutting unit 16, and the main pressure bonding unit 26.

The controller 31 is connected to the provisional pressure bonding attachment 9, and can control the suction state of the provisional pressure bonding attachment 9.

The controller 31 is connected to the provisional pressure bonding image recognition device 11 and the cutting image recognition device 20, controls the provisional pressure bonding image recognition device 11 and the cutting image recognition device 20, and can acquire position information about the semiconductor wafers W and the provisional pressure-bonded laminate WL.

The controller 31 is connected to the conveyor device 30 can control the conveyor device 30.

The controller 31 is connected to the provisional pressure bonding distance sensor 10 and the cutting distance sensor 19, and can acquire the distance L(m) to each layer of the provisional pressure-bonded laminate WL measured by the provisional pressure bonding distance sensor 10 (the distances L1, L2, and L3 in this embodiment), and the distance L(n) to the provisional pressure-bonded laminate WL measured by the cutting distance sensor 19 (the distance L3 in this embodiment).

The control of the spacing between the through-electrodes Pb and the solder Pa of adjacent semiconductor wafers W using the NCF in the provisional pressure bonding of the semiconductor mounting device 1 pertaining to the present invention will now be described through reference to FIGS. 5 to 7, using the first semiconductor wafer W1 and the second semiconductor wafer W2.

Figure 5:
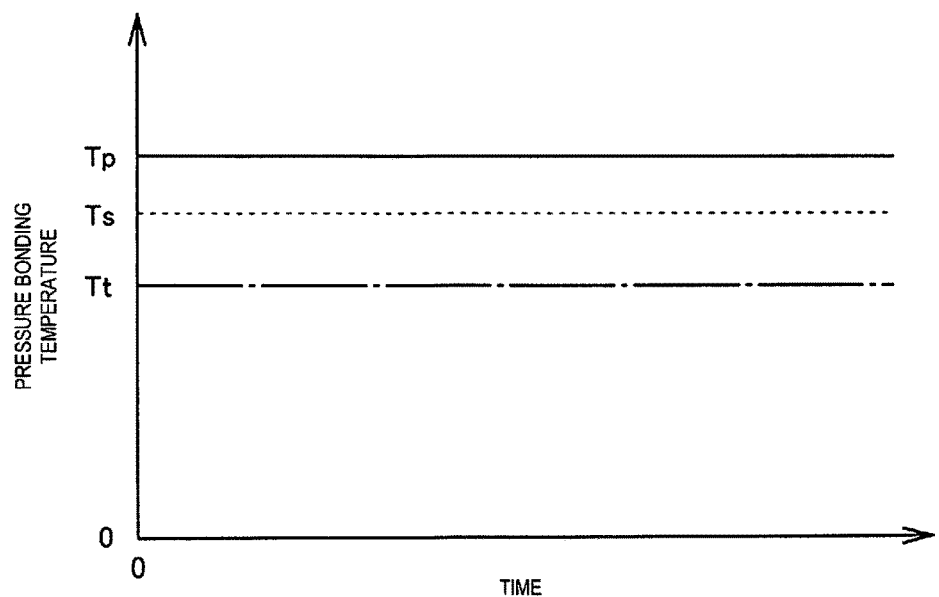
FIG. 5 is a graph of the temperature state during pressing in the semiconductor mounting device pertaining to an embodiment of the present invention.
Figure 6:
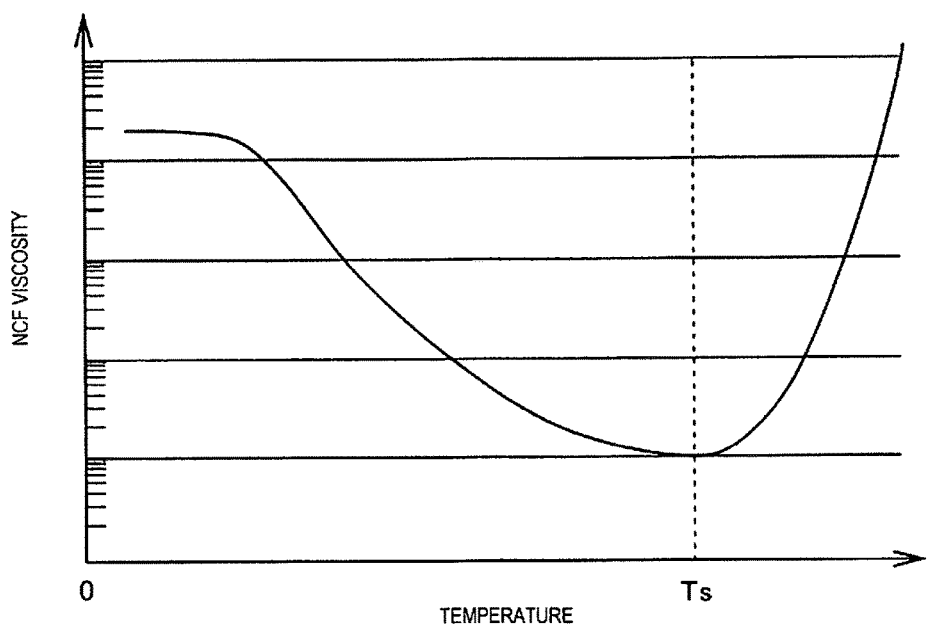
FIG. 6 is a graph of the relation between the temperature and viscosity of an NCF used in the semiconductor mounting device pertaining to an embodiment of the present invention.

As shown in FIG. 6, the viscosity of the NCF varies with its temperature. More specifically, a property of an NCF composed of a thermosetting resin is that in a temperature range below a reference temperature Ts (see FIG. 5) established from the characteristics of the NCF, it will not cure and its viscosity decreases reversibly as the temperature rises. On the other hand, a property of this NCF is that in a temperature range at or above the reference temperature Ts, it will cure and its viscosity increases irreversibly as the temperature rises.

As shown in FIGS. 5 and 6, the semiconductor mounting device 1 is such that in the provisional pressure bonding step, the second semiconductor wafer W2 that is held by suction to the provisional pressure bonding attachment 9 of the provisional pressure bonding device 2 is heated to a specific provisional pressure bonding temperature Tt by the provisional pressure bonding heater 8. Along with this, the NCF affixed so as to cover the solder Pa of the second semiconductor wafer W2 is heated to a provisional pressure bonding temperature Tt that is substantially the same as that of the second semiconductor wafer W2 because of heat transfer from the second semiconductor wafer W2. The provisional pressure bonding temperature Tt here is set lower than the reference temperature Ts. That is, with the semiconductor mounting device 1, the temperature of the provisional pressure bonding heater 8 is controlled so that the NCF reaches a specific viscosity in a temperature range in which the NCF does not cure.

Figure 7A:
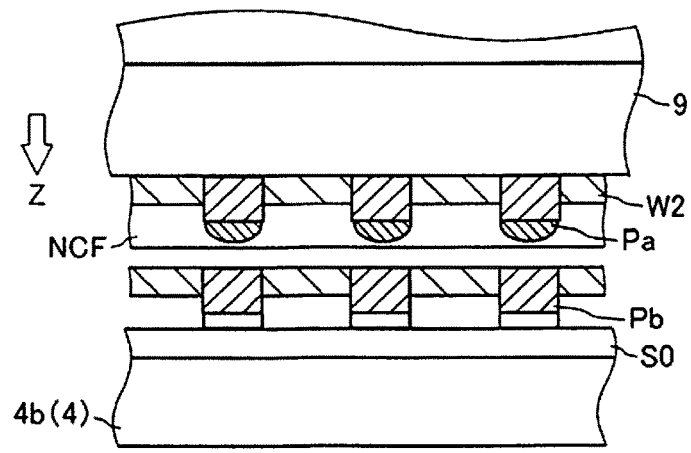
FIG. 7A is a simplified diagram showing a mode in which a semiconductor wafer is brought close to another semiconductor wafer in the provisional pressure bonding step of the semiconductor mounting device pertaining to an embodiment of the present invention.
Figure 7B:
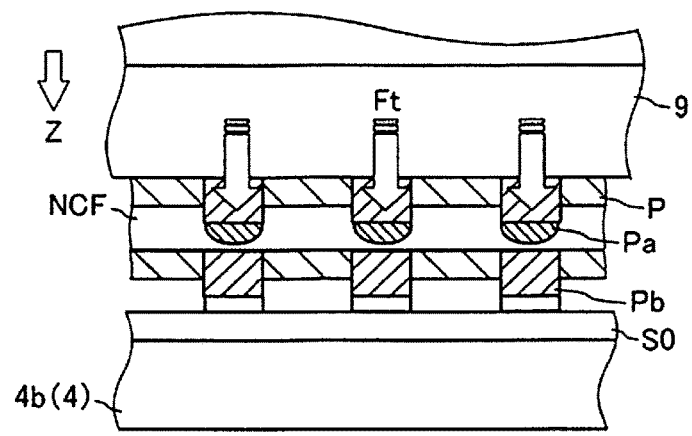
FIG. 7B is a simplified diagram showing a mode in which a semiconductor wafer is pressed against another semiconductor wafer in this provisional pressure bonding step.

As shown in FIG. 7A, with the semiconductor mounting device 1, the second semiconductor wafer W2, which has been heated to the provisional pressure bonding temperature Tt, is moved by the provisional pressure bonding unit 6 in the Z axis direction toward the first semiconductor wafer W1. As shown in FIG. 7B, the second semiconductor wafer W2 that has been moved toward the first semiconductor wafer W1 is such that the NCF affixed so as to cover the solder Pa comes into contact with the pads Ca on the semiconductor wafer W. With the second semiconductor wafer W2, the NCF comes into contact with the through-electrodes Pb of the first semiconductor wafer W1, and as a result the provisional pressure bonding load Ft from the provisional pressure bonding unit 6 is applied in the Z axis direction.

The NCF of the second semiconductor wafer W2 is steadily deformed by the provisional pressure bonding load Ft of the provisional pressure bonding unit 6. Here, a counterforce is produced in the second semiconductor wafer W2 that is produced by the viscous resistance of the NCF to the provisional pressure bonding load Ft. The counterforce produced by viscous resistance of the NCF in the second semiconductor wafer W2 increases according to the amount of deformation of the NCF that has been sandwiched between the solder Pa of the second semiconductor wafer W2 and the through-electrodes Pb of the first semiconductor wafer W1. Accordingly, the position of the second semiconductor wafer W2, to which the provisional pressure bonding load Ft is applied, in the Z axis direction is set upon reaching an amount of deformation of the NCF at which a counterforce is produced by viscous resistance that is proportionate to the provisional pressure bonding load Ft.

Figure 7C:
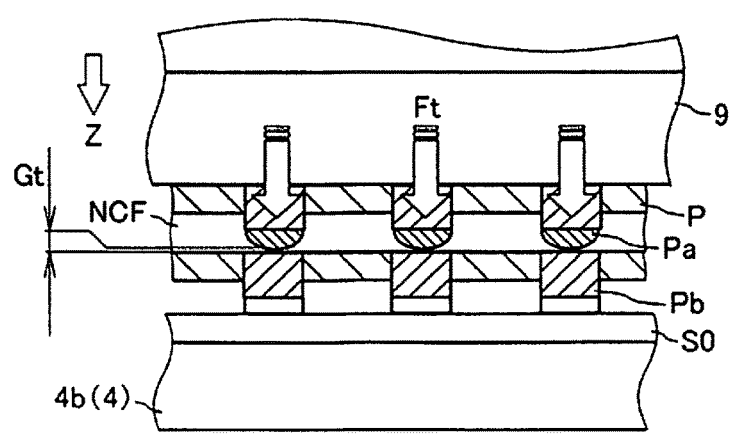
FIG. 7C is a simplified diagram showing a mode in which a semiconductor wafer is pressed against another semiconductor wafer and their position in the Z axis direction is set in the provisional pressure bonding step.

Specifically, the position of the second semiconductor wafer W2 in the Z axis direction in the provisional pressure bonding step is determined by the viscosity of the NCF and the provisional pressure bonding load Ft. Therefore, as shown in FIG. 7C, with the semiconductor mounting device 1, the spacing between the through-electrodes Pb of the first semiconductor wafer W1 and the solder Pa of the second semiconductor wafer W2 can be set within any specific range Gt depending on the temperature of the provisional pressure bonding heater 8 for setting the viscosity of the NCF and the provisional pressure bonding load Ft produced by the provisional pressure bonding unit 6 in the provisional pressure bonding device 2. The position of the second semiconductor wafer W2 in the Z axis direction can be controlled by means of the provisional pressure bonding load Ft and the provisional pressure bonding time at any viscosity the NCF.

A method for manufacturing the laminate chip part PL, which is a semiconductor device related to the semiconductor mounting device 1 pertaining to the present invention, will now be described through reference to FIGS. 8 to 10. The method for manufacturing the laminate chip part PL pertaining to the present invention includes a provisional pressure bonding step, a cutting step, and a main pressure bonding step. In this embodiment, the laminate chip part PL is a memory device.

Figure 8A:
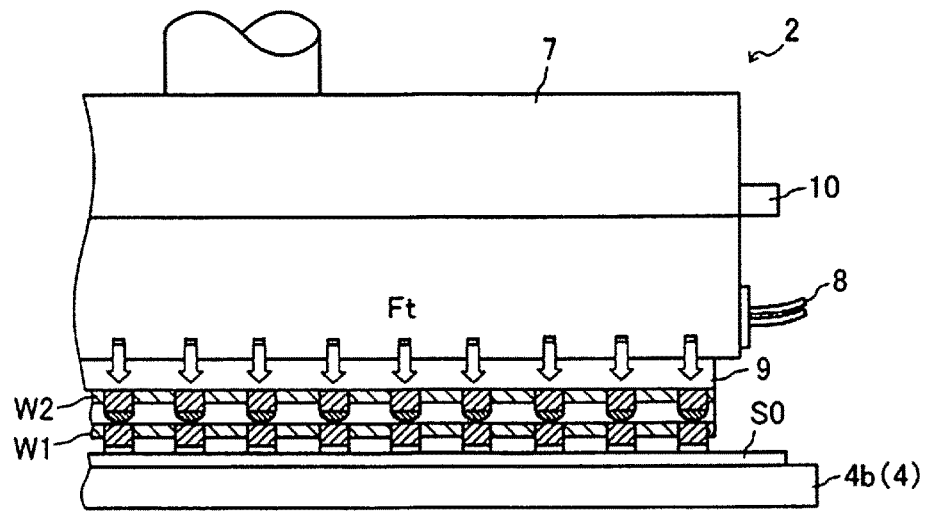
FIG. 8A is a simplified diagram showing a mode in which a semiconductor wafer is provisionally pressure bonded to another semiconductor wafer in the provisional pressure bonding step of the semiconductor mounting device pertaining to an embodiment of the present invention.

As shown in FIG. 8A, in the provisional pressure bonding step, the semiconductor mounting device 1 disposes the first semiconductor wafer W1, which is held by suction against the provisional pressure bonding attachment 9 of the provisional pressure bonding device 2, on the support substrate S0, which is held by suction on the provisional pressure bonding stage 4 of the provisional pressure bonding device 2. The semiconductor mounting device 1 also heats the second semiconductor wafer W2 to the provisional pressure bonding temperature Tt with the provisional pressure bonding heater 8 of the provisional pressure bonding device 2 while the wafer is held by the provisional pressure bonding attachment 9. The provisional pressure bonding temperature Tt is set lower than the reference temperature Ts (see FIG. 5). Specifically, the semiconductor mounting device 1 controls the temperature of the provisional pressure bonding heater 8 so that the NCF will be at a specific viscosity in a temperature range in which the NCF does not cure.

The semiconductor mounting device 1 positions the second semiconductor wafer W2 in the X axis direction, the Y axis direction, and the θ direction so that the solder Pa or the through-electrodes Pb of the first semiconductor wafer W1 will overlap the solder Pa or the through-electrodes Pb of the second semiconductor wafer W2. The semiconductor mounting device 1 uses the provisional pressure bonding attachment 9 to press the second semiconductor wafer W2 under the provisional pressure bonding load Ft while subjecting the first semiconductor wafer W1 to provisional pressure bonding. At this time, the semiconductor mounting device 1 performs provisional pressure bonding so that the spacing between the solder Pa of the second semiconductor wafer W2 and the through-electrodes Pb of the first semiconductor wafer W1 will fall within a specific range Gt (see FIG. 7C). Here, the specific range Gt is preferably in the 1 to 5 μm, and more preferably 1 to 3 μm. This value is determined experimentally, and it is known that if the spacing is narrower than this or when the through-electrodes Pb of the first semiconductor wafer W1 come into contact with the solder Pa of the second semiconductor wafer W2, when the two are connected in the connection step (discussed below), it is possible that an adhesive will remain between the solder Pa and the through-electrodes Pb. It is believed that this is because the solder melts and the NCF is pulled in due to warming up to the melting point of the solder. Also, if the spacing is widened more than this value, there is a possibility that misalignment will occur in the main pressure bonding step, which is a serious quality problem.

Figure 8B:
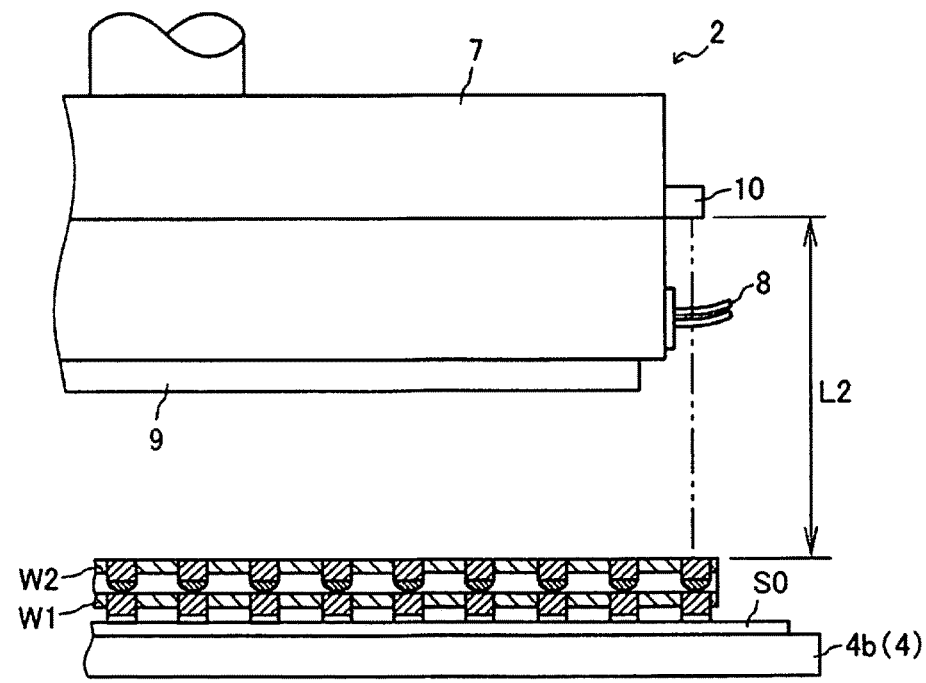
FIG. 8B is a simplified diagram showing a mode in which the distance is measured after provisional pressure bonding in this provisional pressure bonding step.

As shown in FIG. 8B, the semiconductor mounting device 1 measures the distance L2 from an arbitrary reference position of the provisional pressure bonding head 7 to the second semiconductor wafer W2 when the second semiconductor wafer W2 undergoes provisional pressure bonding. Similarly, until the provisional pressure-bonded laminate WL is formed (in this embodiment, a three-layer provisional pressure-bonded laminate WL), the semiconductor mounting device 1 uses the provisional pressure bonding attachment 9 to heat the m-th semiconductor wafer W(m) to the provisional pressure bonding temperature Tt while pressing at the provisional pressure bonding load Ft so that this wafer is provisionally pressure bonded to the (m−1)-th semiconductor wafer W(m−1), and measures the distance L(m). In this manner, the semiconductor mounting device 1 produces the provisional pressure-bonded laminate WL in the provisional pressure bonding step. In another embodiment of the provisional pressure bonding step, the semiconductor mounting device 1 may be configured to heat to the provisional pressure bonding temperature Tt in a vacuum oven and press at the provisional pressure bonding load Ft.

Figure 9A:
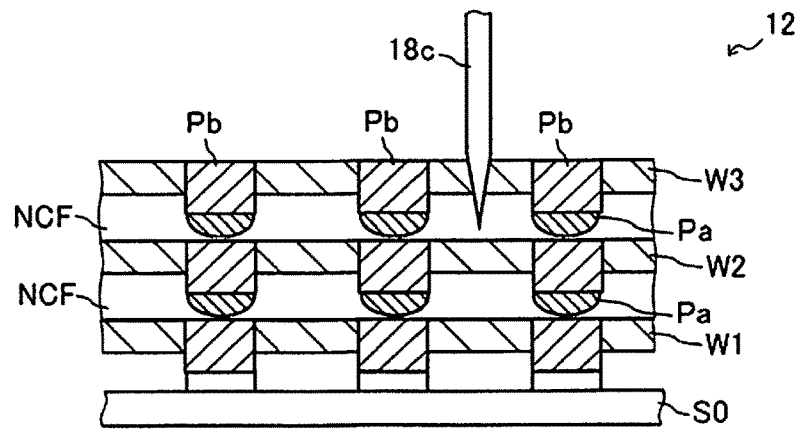
FIG. 9A is a simplified diagram showing a mode in which the uppermost semiconductor wafer is cut with a dicing blade having the largest blade width in the cutting step of the semiconductor mounting device pertaining to an embodiment of the present invention.
Figure 9B:
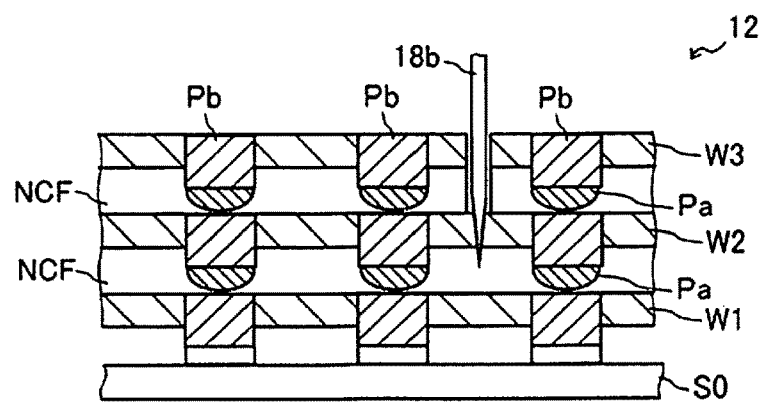
FIG. 9B is a simplified diagram showing a mode in which the next semiconductor wafer is cut with a dicing blade having the next largest blade width.
Figure 9C:
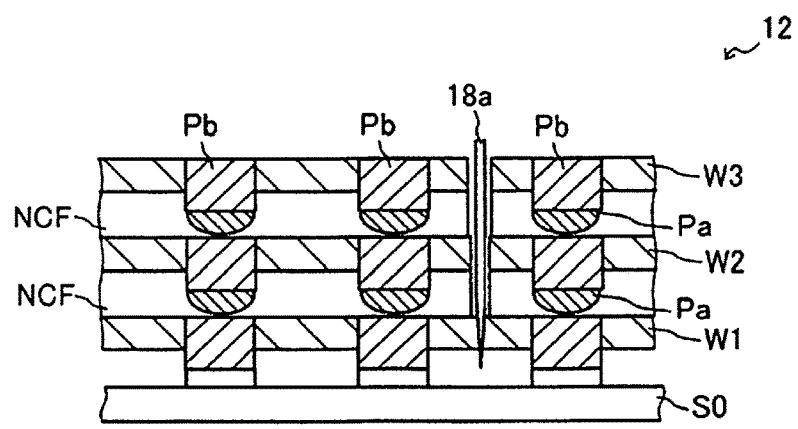
FIG. 9C is a simplified diagram showing a mode in which the lowermost semiconductor wafer is cut by dicing blade having the smallest blade width.
Figure 10A:
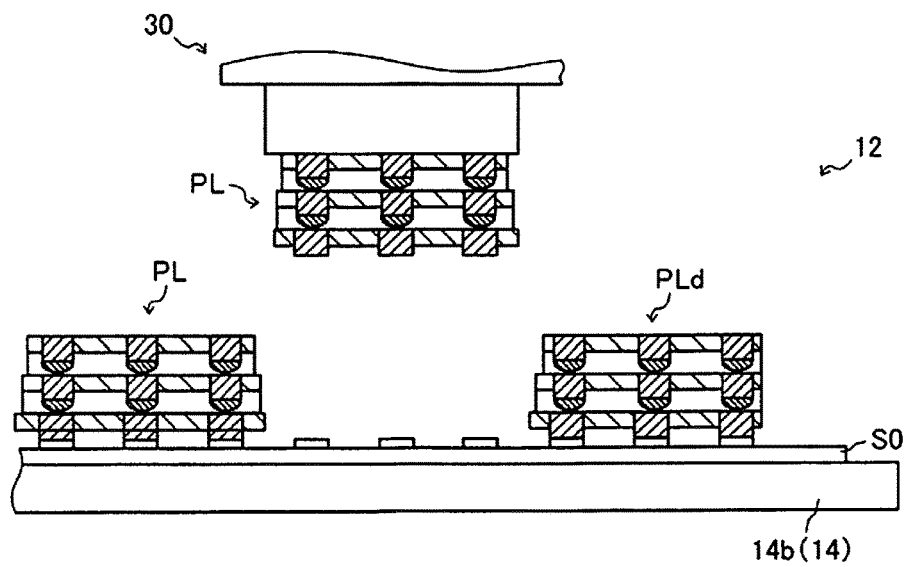
FIG. 10A is a simplified diagram showing a mode in which a laminate chip part exclusive of defective chip parts is conveyed in the cutting step of the semiconductor mounting device pertaining to an embodiment of the present invention.

Next, as shown in FIG. 9, in the cutting step, the semiconductor mounting device 1 uses suction to hold the n-layer of the provisional pressure-bonded laminate WL that is has been conveyed by the conveyor device 30 to the cutting stage 14 of the cutting device 12. The semiconductor mounting device 1 uses the dicing blades 18 of the cutting device 12 to cut each of the semiconductor wafers W constituting the provisional pressure-bonded laminate WL, on the basis of the measured value of the cutting distance sensor 19 of the cutting device 12 and the measured value of the provisional pressure bonding distance sensor 10 of the provisional pressure bonding device 2. In this embodiment, as shown in FIG. 9A, the semiconductor mounting device 1 uses the third dicing blade 18c of the cutting device 12 to cut just the third semiconductor wafer W3 (the uppermost layer) of the three-layer provisional pressure-bonded laminate WL. At this point, the semiconductor mounting device 1 cuts the third semiconductor wafer W3, conforming to the shape of the provisional pressure-bonded laminate chip part PL. Furthermore, as shown in FIG. 9B, the semiconductor mounting device 1 uses the second dicing blade 18b, whose blade width is less than that of the third dicing blade 18c, to cut just the second semiconductor wafer W2 on the basis of the distance L2, which is the measured value of the provisional pressure bonding distance sensor 10 of the provisional pressure bonding device 2. Similarly, as shown in FIG. 9C, the semiconductor mounting device 1 uses the first dicing blade 18a, whose blade width is less than that of the second dicing blade 18b, to cut just the first semiconductor wafer W1. In this manner, in the cutting step the semiconductor mounting device 1 produces the provisional pressure-bonded laminate chip part PL while suppressing contact between the dicing blades and the semiconductor wafers W by successively using dicing plates 18 thinner than the cutting width. As shown in FIG. 10A, after the provisional pressure-bonded laminate WL has been cut, the semiconductor mounting device 1 uses the conveyor device 30 to convey laminate chip parts PL, exclusive of laminate chip parts PLd that include defective chip parts, to the main pressure bonding stage 24 of the main pressure bonding device 22 on the basis of information about defective chip parts in the semiconductor wafers W acquired in the upstream steps. That is, the semiconductor mounting device 1 expels any laminate chip parts PLd that include defective chip parts on the basis of information about defective chip parts. Since the NCF is cut at the same time as the semiconductor wafers W, there is almost no bulging of the NCF into the laminate chip parts PL after dicing (bulging is no more than 1μ). This state in which there is no bulging of the NCF at the laminate chip parts PL allows the cut surfaces to be checked by optical microscopic observation.

Figure 10B:
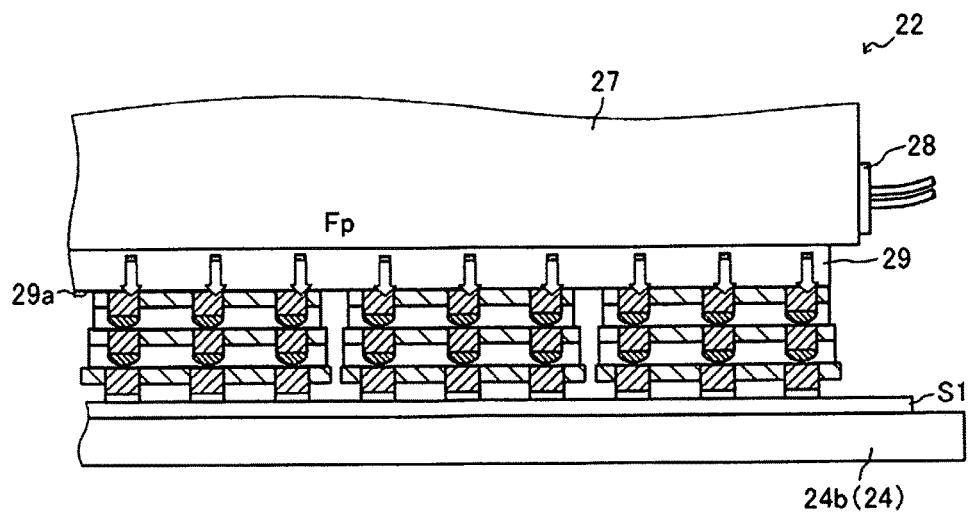
FIG. 10B is a simplified diagram showing a mode in which the provisional pressure-bonded laminate chip part is subjected to main pressure bonding to a mounting board in the main pressure bonding step.

Next, as shown in FIG. 10B, in the main pressure bonding step, the semiconductor mounting device 1 conveys to a specific location the plurality of provisional pressure-bonded laminate chip parts PL relative to the mounting substrate S1 held by suction to the main pressure bonding stage 24 of the main pressure bonding device 22. The semiconductor mounting device 1 then brings the main pressure bonding attachment 29 of the main pressure bonding device 22 into contact with the plurality of provisional pressure-bonded laminate chip parts PL all at once, and heats to main pressure bonding temperature Tp. This main pressure bonding temperature Tp is set within a range of at least the reference temperature Ts and at least the melting point of the solder Pa (see FIG. 5). That is, the semiconductor mounting device 1 controls the temperature of the main pressure bonding heater 28 so that the solder Pa will melt and the NCF will cure and be at a specific viscosity for main pressure (hardness). Furthermore, the semiconductor mounting device 1 uses the main pressure bonding attachment 29 to press the plurality of provisional pressure-bonded laminate chip parts PL is all at once under the main pressure bonding load Fp. The chip parts P are close enough to the through-electrodes Pb so that there is no gap between them and the solder Pa. The provisional pressure-bonded laminate chip parts PL are such that adjacent chip parts P are fixed (undergo main pressure bonding) by the thermosetting NCF, and the solder Pa melts to make an electrical connection with the through-electrodes Pb of the adjacent chip parts P. The main pressure bonding contact face 29a of the main pressure bonding attachment 29 is brought into contact substantially simultaneously and uniformly with the chip parts P. That is, the main pressure bonding of the chip parts P is carried out by the main pressure bonding device 22 in a state in which the heating duration, the heating time, the pressing force, and so forth are substantially uniform.

A control mode for manufacturing a semiconductor device comprising n layers of laminate chip parts PL in the semiconductor manufacturing device 1 pertaining to the present invention will now be described through reference to FIGS. 11 to 14. In the following control mode, let us assume that the provisional pressure bonding heater 8 maintains, in advance, the temperature necessary to heat the chip parts P to the provisional pressure bonding temperature Tt, and the main pressure bonding heater 28 maintains, in advance, the temperature necessary to heat the chip parts P to the main pressure bonding temperature Tp. Let us also assume that the controller 31 acquires information about the positions of defective chip parts, out of the chip parts P formed on the first semiconductor wafer W1, the second semiconductor wafer W2, and the third semiconductor wafer W3, from the upstream steps.

Figure 11:
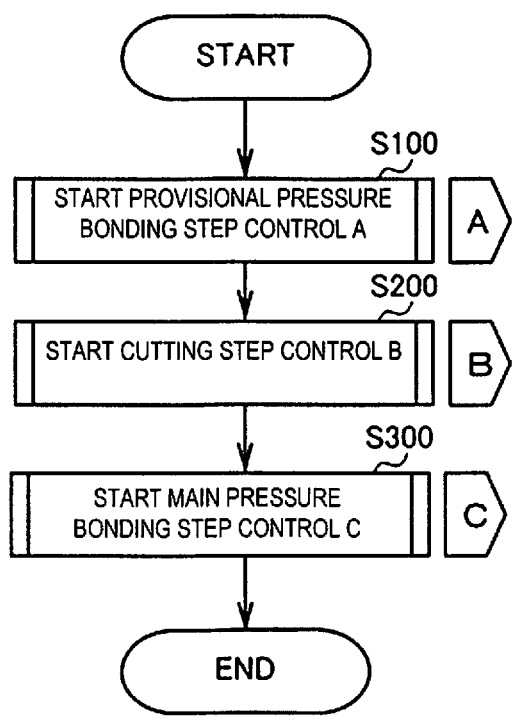
FIG. 11 is a flowchart showing the overall control mode of the semiconductor mounting device pertaining to an embodiment of the present invention.
Figure 12:
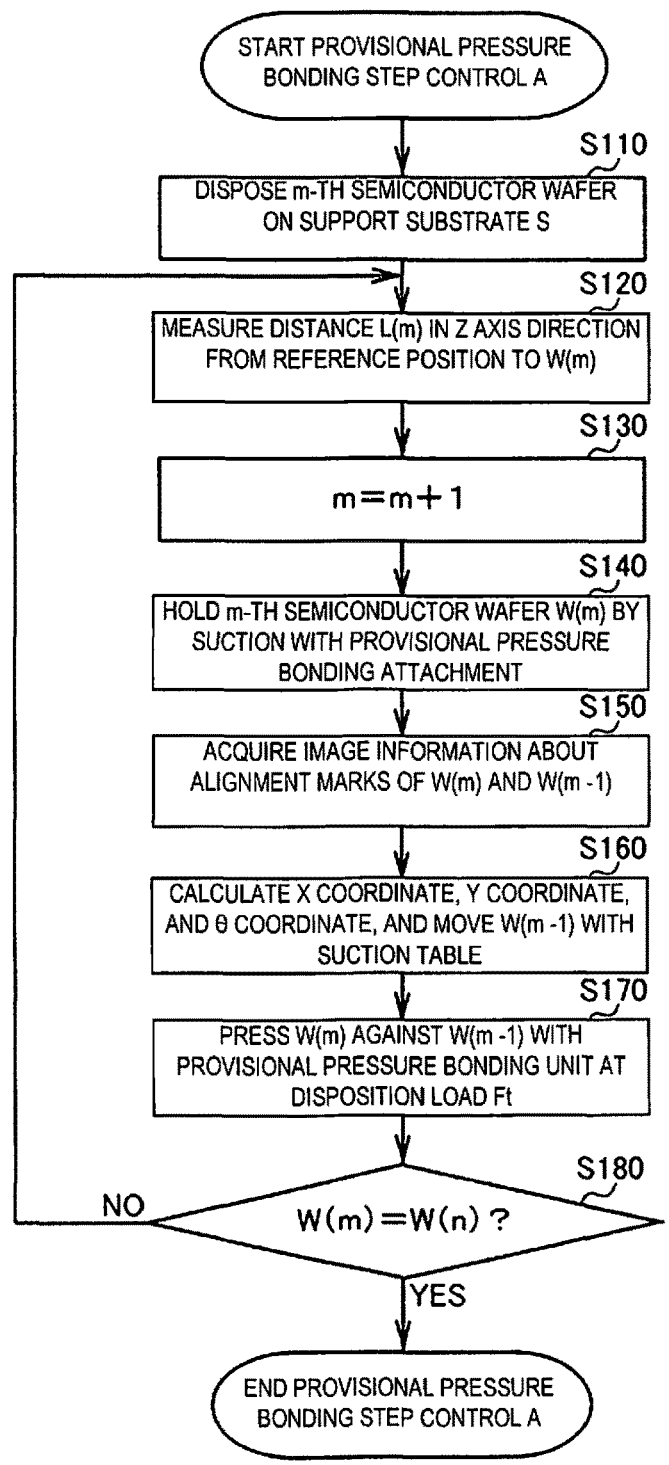
FIG. 12 is a flowchart showing the control mode in the provisional pressure bonding step of the semiconductor mounting device pertaining to an embodiment of the present invention.

As shown in FIG. 11, in step S100, the controller 31 starts provisional pressure bonding step control A, and the flow proceeds to step 110 (see FIG. 12). Once the provisional pressure bonding step control A is complete, the flow proceeds to step S200.

Figure 13:
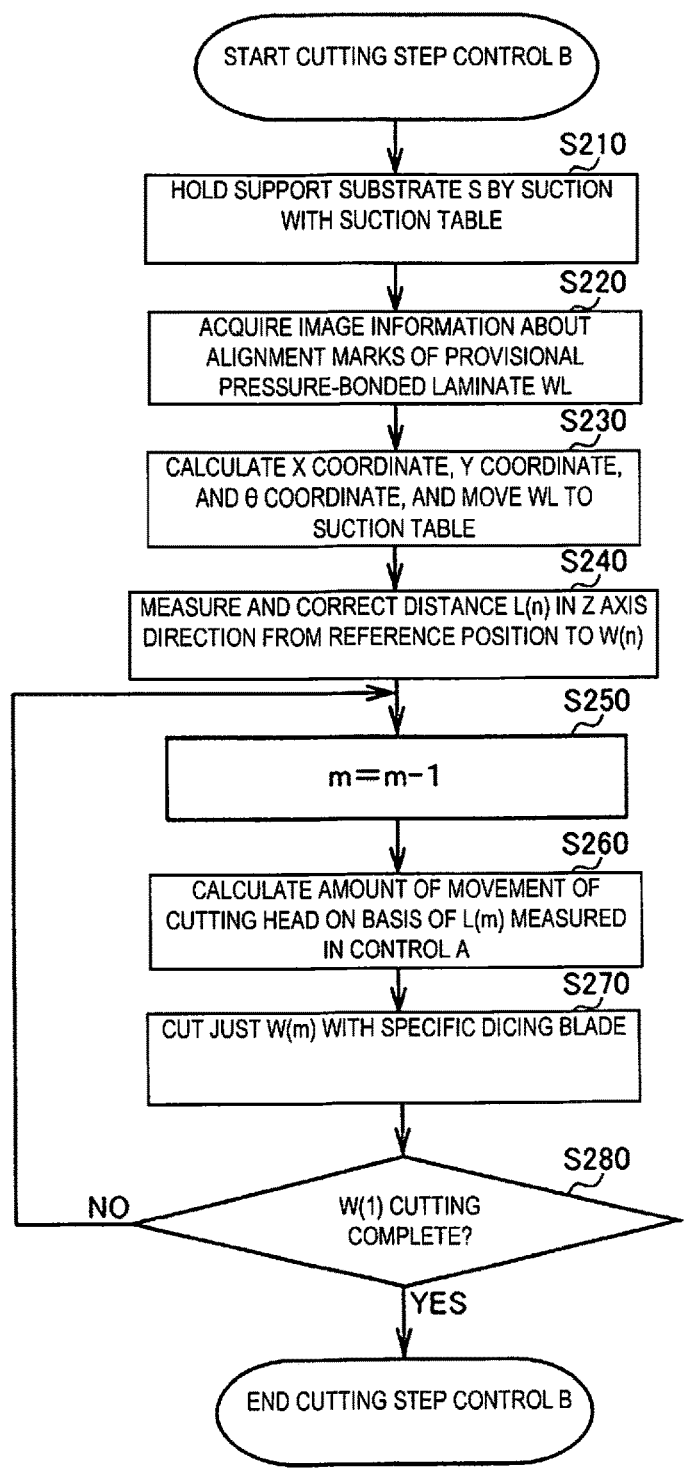
FIG. 13 is a flowchart showing the control mode in the cutting step of the semiconductor mounting device pertaining to an embodiment of the present invention.

In step S200, the controller 31 starts cutting step control B, and the flow proceeds to step 210 (see FIG. 13). Once the cutting step control B ends, the flow proceeds to step S300.

Figure 14:
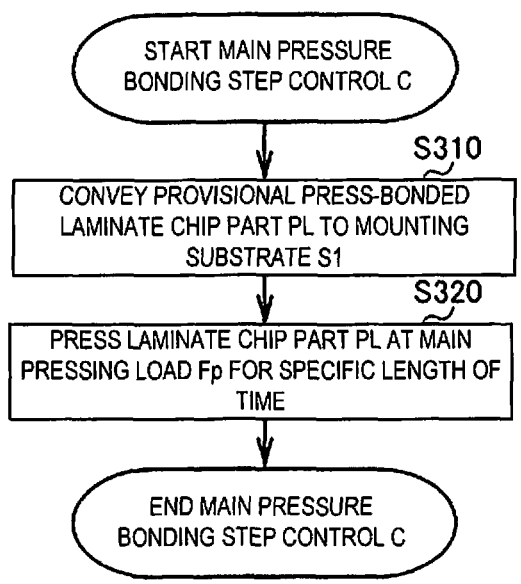
FIG. 14 is a flowchart showing the control mode in the main pressure bonding step of a semiconductor mounting device pertaining to an embodiment of the present invention.

In step S300, the controller 31 starts main pressure bonding step control C, and the flow proceeds to step 310 (see FIG. 14). Once the main pressure bonding step control C ends, the flow is terminated.

As shown in FIG. 12, in step S110, the controller 31 disposes the m-th semiconductor wafer W(m) held by suction by the provisional pressure bonding attachment 9 on the support substrate S0 on the provisional pressure bonding stage 4, and the flow proceeds to step S120 (m=1).

In step S120, the controller 31 uses the provisional pressure bonding distance sensor 10 to measure the distance L(m) in the Z axis direction from an arbitrary reference position of the provisional pressure bonding unit 6 to the m-th semiconductor wafer W(m), and the flow proceeds to step S130.

In step S130, the controller 31 sets m to m+1, and the flow proceeds to step S140.

In step S140, the controller 31 uses the provisional pressure bonding attachment 9 of the provisional pressure bonding head 7 to hold the m-th semiconductor wafer W(m) by suction, and the flow proceeds to step S150 (m≥2).

In step S150, the controller 31 uses the provisional pressure bonding image recognition device 11 to acquire image information about an alignment mark of the m-th semiconductor wafer W(m) held by suction to the provisional pressure bonding attachment 9 of the provisional pressure bonding head 7, and an alignment mark of the (m−1)-th semiconductor wafer W(m−1) held by suction to the provisional pressure bonding stage 4, and the flow proceeds to step S160.

In step S160, the controller 31 calculates the coordinate positions in the X axis direction, the Y axis direction, and the θ direction of the provisional pressure bonding stage 4 for positioning the (m−1)-th semiconductor wafer W(m−1) and the m-th semiconductor wafer W(m) on the basis of the acquired image information about the (m−1)-th semiconductor wafer W(m−1) and the m-th semiconductor wafer W(m), and uses the drive unit 4a to move the suction table 4b of the provisional pressure bonding stage 4, and the flow proceeds to step S170. In step S170, the controller 31 uses the provisional pressure bonding unit 6 to perform provisional pressure bonding by pressing the m-th semiconductor wafer W(m) held by suction to the provisional pressure bonding attachment 9 against the (m−1)-th semiconductor wafer W(m−1) on the provisional pressure bonding stage 4 for a specific length of time at the provisional pressure bonding load Ft, and the flow proceeds to step S180.

In step S180, the controller 31 determines whether or not the provisional pressure bonding of the n-th semiconductor wafer W(n) by the provisional pressure bonding unit 6 is complete, that is, whether or not the provisional pressure-bonded laminate WL is complete for the m=n layer.

As a result, if it is determined that the provisional pressure bonding of the n-th semiconductor wafer W(n) by the provisional pressure bonding unit 6 is complete, that is, if it is determined that the provisional pressure-bonded laminate WL for the m=n layer is complete, the control device 31 terminates the provisional pressure bonding step control A, and the flow proceeds to step S200 (see FIG. 11).

On the other hand, if it is determined that the provisional pressure bonding of the n-th semiconductor wafer W(n) by the provisional pressure bonding unit 6 is not complete, that is, if it is determined that the provisional pressure-bonded laminate WL for m=n layer is not complete, the controller 31 proceeds to step S120.

As shown in FIG. 13, in step S210, the control device 31 uses the suction table 14b of the cutting stage 14 to hold by suction the support substrate S0 (the provisional pressure-bonded laminate WL) conveyed by the conveyor device 30 from the provisional pressure bonding stage 4, and the flow proceeds to step S220.

In step S220, the controller 31 uses the cutting image recognition device 20 to acquire image information about the alignment mark of the provisional pressure-bonded laminate WL that is held by suction to the cutting stage 14, and the flow proceeds to step S230.

In step S230, the controller 31 calculates the coordinate positions in the X axis direction, the Y axis direction, and the θ direction of the cutting stage 14 for positioning the provisional pressure-bonded laminate WL on the basis of image information about the provisional pressure-bonded laminate WL, and uses the drive unit 14a to move the suction table 14b of the cutting stage 14, and the flow proceeds to step S240.

In step S240, the control device 31 measures the distance L(n) from an arbitrary reference position of the cutting unit 16 to the n-th semiconductor wafer W(n), and corrects the error in the height direction, and the flow proceeds to step S250.

In step S250, the controller 31 sets m to be m−1, and the flow proceeds to step S260.

In step S260, the controller 31 calculates the amount of movement of the cutting head 17 in order to cut just the m-th semiconductor wafer W(m) on the basis of the distance L(m) in the Z axis direction measured in the provisional pressure bonding step control A, and the flow proceeds to step S270.

In step S270, the controller 31 rotationally drives a specific dicing blade 18 to cut just the m-th semiconductor wafer W(m) (out of the provisional pressure-bonded laminate WL), following the shape of the chip parts P, and the flow proceeds step S280.

In step S280, the controller 31 determines whether or not the cutting of the first semiconductor wafer W1 by the provisional pressure bonding unit 6 has ended.

As a result, if it is determined that the cutting of the first semiconductor wafer W1 by the provisional pressure bonding unit 6 is complete, that is, if a plurality of the provisional pressure-bonded laminate chip parts PL are determined to be complete, the controller 31 ends the cutting step control B, and the flow proceeds to step S300 (see FIG. 9).

On the other hand, if it is determined that the cutting of the first semiconductor wafer W1 by the provisional pressure bonding unit 6 is not complete, that is, if it is determined that a plurality of the provisional pressure-bonded laminate chip parts PL are not complete, the controller 31 proceeds to step S250.

As shown in FIG. 14, in step S310, the controller 31 uses the conveyor device 30 to dispose the laminate chip parts PL, exclusive of provisional pressure-bonded laminate chip parts PLd that include defective chip parts, to a specific position of the mounting substrate S1 that is held by suction to the suction table 24b of the main pressure bonding stage 24, and the flow proceeds to step S320.

In step S320, the controller 31 uses the main pressure bonding unit 26 to fix a plurality of the provisional pressure-bonded laminate chip parts PL by pressing for a specific length of time at the main pressure bonding load Fp, ends the main pressure bonding step control C, and ends this step. A memory device having a laminated structure is manufactured by these steps.

With this configuration, the semiconductor mounting device 1 is such that the first semiconductor wafer W1, the second semiconductor wafer W2, and the third semiconductor wafer W3, on which a plurality of chip parts P are formed, are laminated on the support substrate S0. That is, because the support substrate S0 is used in the provisional pressure bonding step, the semiconductor mounting device 1 simultaneously produces a plurality of laminate chip parts PL (memory devices) all at once while suppressing warping of the semiconductor wafers W. Furthermore, the semiconductor mounting device 1 selectively uses a plurality of dicing plates 18 having different blade widths to cut the provisional pressure-bonded laminate WL. That is, in the cutting step, the semiconductor mounting device 1 produces the provisional pressure-bonded laminate chip parts PL while suppressing deviation during cutting due to contact or the like with the dicing blade 18 by cutting the next semiconductor wafer W with a dicing blade 18 having a thinner cutting width. Also, the semiconductor mounting device 1 performs main pressure bonding after cutting the provisional pressure-bonded laminate WL within a specific range Gt in which the spacing between the adjacent through-electrodes Pb and the solder Pa is sufficiently small. That is, in the cutting step and the main pressure bonding step, the semiconductor mounting device 1 produces laminate chip parts PL, as memory devices, while suppressing deviation during cutting and the occurrence of voids. Also, the semiconductor mounting device 1 expels laminate chip parts PLd that include defective chip parts on the basis of information about defective chip parts. That is, the semiconductor mounting device 1 expels laminate chip parts PLd that are defective for some reason other than cutting. This shortens how long it takes to manufacture a memory device or other such semiconductor device in which chip parts P are laminated and also makes it less likely that there will be joining defects between chip parts P. Also, with the semiconductor mounting device 1, in the provisional pressure bonding step, the occurrence of voids is suppressed by performing the provisional pressure bonding of the first semiconductor wafer W1, the second semiconductor wafer W2, and the third semiconductor wafer W3 in a vacuum oven. This shortens how long it takes to manufacture a memory device or other such semiconductor device in which chip parts P are laminated and also makes it less likely that there will be joining defects between chip parts P.

The invention claimed is:

1. A method for manufacturing a semiconductor device, the method comprising:
    laminating a plurality of semiconductor wafers via an adhesive, with the semiconductor wafers each having a plurality of chip parts with through-electrodes, heating the semiconductor wafers such that the adhesive reaches a specific viscosity, and pressing the semiconductor wafers under a provisional pressure bonding load such that a gap between solder of through-electrodes of a semiconductor wafer and through-electrodes of an adjacent semiconductor wafer falls within a specific range that is greater than zero, to produce a provisional pressure-bonded laminate;
    cutting the provisional pressure-bonded laminate with a cutter to produce a plurality of provisional pressure-bonded laminate chip parts in each of which the chip parts have been laminated;
    mounting the provisional pressure-bonded laminate chip parts on a mounting substrate; and
    heating the provisional pressure-bonded laminate chip parts that have been mounted on the mounting substrate to at least curing temperature of the adhesive and at least melting point of the solder, and pressing the provisional pressure-bonded laminate chip parts that have been mounted on the mounting substrate under a main pressure bonding load all at once to produce the semiconductor device having a plurality of main pressure-bonded laminate chip parts that are electrically connected to each other on the mounting substrate such that the solder comes into contact with the through-electrodes of adjacent chip parts.

2. The method for manufacturing a semiconductor device according to claim 1, wherein
    the cutting of the provisional pressure-bonded laminate includes cutting the laminated semiconductor wafers one at a time by the cutter.

3. The method for manufacturing a semiconductor device according to claim 1, wherein
    the heating and the pressing of the semiconductor wafers include heating and pressing the semiconductor wafers in a vacuum.

4. The method for manufacturing a semiconductor device according to claim 1, wherein
    the laminating, the heating and the pressing of the semiconductor wafers include laminating the semiconductor wafers on a support substrate, and removing the support substrate from the provisional pressure-bonded laminate that have been produced after the heating and the pressing of the semiconductor wafers.

5. A memory device manufactured by the method for manufacturing a semiconductor device according to claim 1.

6. The method for manufacturing a semiconductor device according to claim 2, wherein
    the heating and the pressing of the semiconductor wafers include heating and pressing the semiconductor wafers in a vacuum.

7. The method for manufacturing a semiconductor device according to claim 2, wherein
    the laminating, the heating and the pressing of the semiconductor wafers include laminating the semiconductor wafers on a support substrate, and removing the support substrate from the provisional pressure-bonded laminate that have been produced after the heating and the pressing of the semiconductor wafers.

8. A memory device manufactured by the method for manufacturing a semiconductor device according to claim 2.

9. A memory device manufactured by the method for manufacturing a semiconductor device according to claim 3.

10. A memory device manufactured by the method for manufacturing a semiconductor device according to claim 4.

11. A method for manufacturing a semiconductor device, the method comprising:
    laminating a plurality of semiconductor wafers via an adhesive, with the semiconductor wafers each having a plurality of chip parts with through-electrodes, heating the semiconductor wafers such that the adhesive reaches a specific viscosity, and pressing the semiconductor wafers under a provisional pressure bonding load such that a gap between solder of through-electrodes of a semiconductor wafer and through-electrodes of an adjacent semiconductor wafer falls within a specific range that is greater than zero, to produce a provisional pressure-bonded laminate;

cutting the provisional pressure-bonded laminate with a cutter to produce a provisional pressure-bonded laminate chip part in which the chip parts have been laminated; and heating the provisional pressure-bonded laminate chip part to at least curing temperature of the adhesive and at least melting point of the solder, and pressing the provisional pressure-bonded laminate chip part under a main pressure bonding load to produce a main pressure-bonded laminate chip part such that the solder comes into contact with the through-electrodes of adjacent chip parts, the cutter including a dicing blade, and the cutting of the provisional pressure-bonded laminate including reducing a width of the dicing blade every time a semiconductor wafer is cut.

12. The method for manufacturing a semiconductor device according to claim 11, wherein
the cutting of the provisional pressure-bonded laminate includes cutting the laminated semiconductor wafers one at a time by the cutter.

13. The method for manufacturing a semiconductor device according to claim 11, wherein
the heating and the pressing of the semiconductor wafers include heating and pressing the semiconductor wafers in a vacuum.

14. The method for manufacturing a semiconductor device according to claim 12, wherein
the heating and the pressing of the semiconductor wafers include heating and pressing the semiconductor wafers in a vacuum.

15. The method for manufacturing a semiconductor device according to claim 11, wherein
the laminating, the heating and the pressing of the semiconductor wafers include laminating the semiconductor wafers on a support substrate, and removing the support substrate from the provisional pressure-bonded laminate that have been produced after the heating and the pressing of the semiconductor wafers.

16. The method for manufacturing a semiconductor device according to claim 12, wherein
the laminating, the heating and the pressing of the semiconductor wafers include laminating the semiconductor wafers on a support substrate, and removing the support substrate from the provisional pressure-bonded laminate that have been produced after the heating and the pressing of the semiconductor wafers.

17. A memory device manufactured by the method for manufacturing a semiconductor device according to claim 11.

18. A semiconductor mounting device configured to manufacture a semiconductor device, the semiconductor mounting device comprising:

a provisional pressure bonding device configured to laminate a plurality of semiconductor wafers via an adhesive, with the semiconductor wafers each having a plurality of chips with through-electrodes, configured to heat the semiconductor wafers such that the adhesive reaches a specific viscosity, and configured to press the semiconductor wafers under a provisional pressure bonding load to produce a provisional pressure-bonded laminate such that a gap between solder of through-electrodes of a semiconductor wafer and through-electrodes of an adjacent semiconductor wafer falls within a specific range that is greater than zero;

a cutting device configured to cut the provisional pressure-bonded laminate with a cutter to produce a provisional pressure-bonded laminate chip part in which the chip parts have been laminated; and a controller configured to acquire ahead of time a location of a defective chip part out of the chip parts formed on the semiconductor wafers, and configured to expel a provisional pressure-bonded laminate chip part that includes the defective chip part out of provisional pressure-bonded laminate chip parts that have been produced.

* * * * *